United States Patent [19]

Bae

[11] Patent Number: 5,633,173
[45] Date of Patent: May 27, 1997

[54] METHOD FOR DETECTING WAFER DEFECTS

[75] Inventor: Sang M. Bae, Kyoungki-do, Rep. of Korea

[73] Assignee: Hyundai Electronics Industries Co., Ltd., Kyoungki-do, Rep. of Korea

[21] Appl. No.: 502,178

[22] Filed: Jul. 13, 1995

[30] Foreign Application Priority Data

Jul. 14, 1994 [KR] Rep. of Korea ............... 94-16959

[51] Int. Cl.$^6$ ............................................. H01L 21/66
[52] U.S. Cl. .......................... 438/16; 430/22; 430/30
[58] Field of Search .................... 430/311, 313, 430/314, 22, 30; 437/924, 7, 8

[56] References Cited

U.S. PATENT DOCUMENTS

| 4,134,066 | 1/1979 | Vogel et al. | 437/8 |
| 5,478,762 | 12/1995 | Chao | 437/34 |

FOREIGN PATENT DOCUMENTS

| 58-50750 | 3/1983 | Japan | 437/8 |
| 58-50728 | 3/1983 | Japan | 437/924 |
| 61-32550 | 2/1986 | Japan | 437/8 |
| 61-71645 | 4/1986 | Japan | 437/8 |
| 62-47142 | 2/1987 | Japan | 437/8 |
| 3-233955 | 10/1991 | Japan . | |
| 6-120311 | 4/1994 | Japan | 437/8 |

OTHER PUBLICATIONS

J. Ryuta, et al., Jpn. J. Appl. Phys., 31, 3B(1992) L293, "Effect of . . . Crystal-Originated Particles on Si Wafers".

*Primary Examiner*—Charles L. Bowers, Jr.
*Assistant Examiner*—Leon Radomsky
*Attorney, Agent, or Firm*—Reid & Priest LLP

[57] ABSTRACT

A method for detecting wafer defects, comprising the steps of: forming dummy dies useful as an alignment mark at edge portions of a flat wafer, the edge portions having no pattern die; loading the wafer in a defect detecting apparatus; arranging the edge portions of the dummy dies; inspecting the wafer for defects to give data for the defects; and carrying out subsequent processes, according to which the detected defects are utilized to inspect for process defects at subsequent process steps, which makes it easy to monitor organic relations between the wafer defects and the process defects and between the process defects themselves.

5 Claims, 1 Drawing Sheet

METHOD FOR DETECTING WAFER DEFECTS

BACKGROUND OF THE INVENTION

1. Field of the Invention

The present invention relates, in general, to a method for detecting wafer defects and, more particularly, to formation of dummy dies at edge portions of a flat wafer which are utilized as an alignment mark such that the data for wafer defects can be maintained at further processes.

2. Description of the Prior Art

A semiconductor device is obtained by carrying out many process steps on a wafer. The reliability and yield of the semiconductor device can be improved by detecting various defects which may be generated in each step with a defect detecting apparatus and analyzing the causes of the defects rapidly and smoothly.

From an early step of a fabrication method of a semiconductor device, responsible for a flat wafer such as a better wafer, a well-formed wafer or a film-deposited wafer, until a step just prior to forming an element isolation film, no alignment mark is formed on the wafer.

When the flat wafer having no alignment mark is inspected for defects by a detecting apparatus, the sizes and coordinates (x, y) of defects in the flat wafer are determined. However, when reviewing the wafer defects after the wafer has been withdrawn from the apparatus, the pre-determined coordinates cannot be found because the wafer has been inspected for the defects in the absence of an alignment mark, a reference of the wafer. That is, it is anticipated that the wafer devoid of an alignment mark plays no role in utilizing the data for defects. This is attributed to the fact that, although there is information for the coordinates and sizes of defects which are detected before the element-isolating step, the absence of reference coordinates in the wafer cannot allow the detected coordinates and sizes to be correctly connected with the data for defects which are inspected with a reference of a certain point within a pattern before the element-isolating step. Accordingly, researchers always find great difficulty in defect analysis because they cannot know which steps the defects are generated at or how the defects progress.

SUMMARY OF THE INVENTION

Accordingly, it is an object of the present invention to overcome the above-mentioned problems encountered in the prior art and to provide a method for detecting wafer defects, which results in utilization of data for the defects at subsequent processes by forming alignment marks at edge portions of the wafer which affect the subsequent processes as little as possible.

In accordance with the present invention, the above object could be accomplished by providing a method for detecting wafer defects, comprising the steps of: forming dummy dies useful as an alignment mark at edge portions of a flat wafer, said edge portions having no pattern die; loading the wafer in a defect detecting apparatus; arranging the edge portions of the dummy dies; inspecting the wafer for defects to give data for the defects; and carrying out subsequent processes.

DETAILED DESCRIPTION OF THE INVENTION

Figure 1:
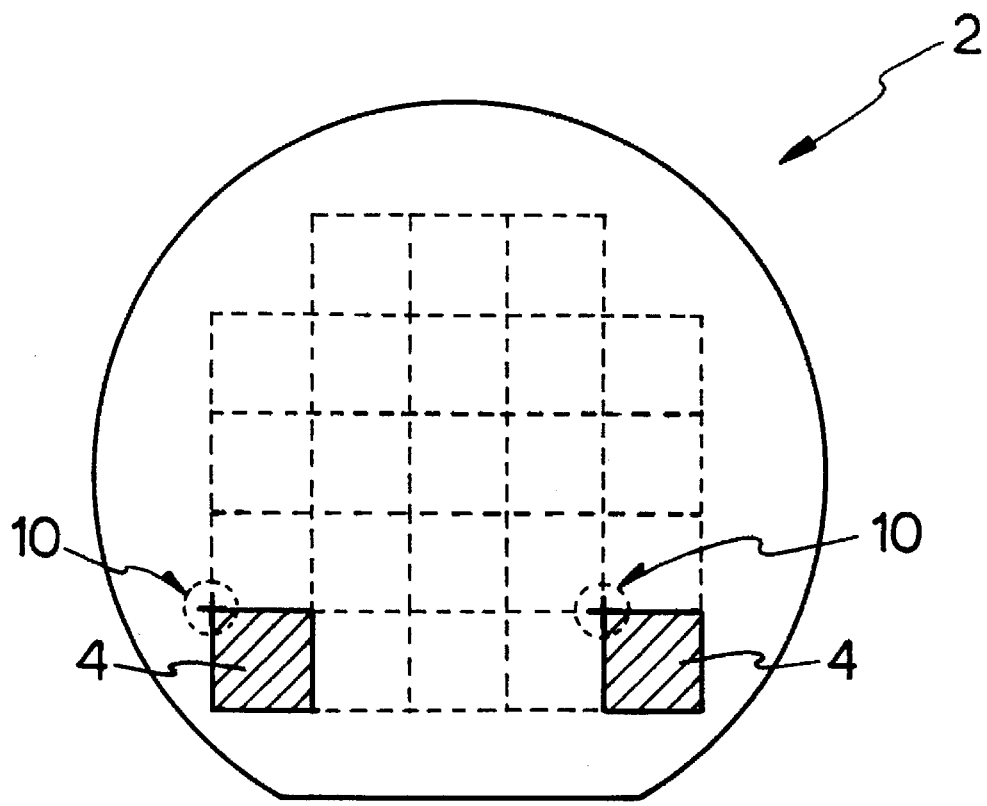
FIG. 1 is a schematic top view showing dummy dies formed at edge portions of a wafer, which are used as an alignment mark.

The application of the preferred embodiments of the present invention is best understood with reference to the accompanying drawing.

With reference to FIG. 1, there is a top view of a flat wafer 2 showing that dummy dies 4, useful as an alignment mark, are formed at the regions in which no pattern die (shown in dotted lines) is formed. As shown in this figure, the dummy dies are formed with rectangular protrusive or depressive photosensitive film patterns.

When forming a reticle mask that is used in a stepper, a job file program is utilized to form two dummy dies 4 at the edges of the wafer in which no pattern die is present.

In addition, the dummy dies formed with photosensitive film patterns may be etched to a certain depth, so as to maintain them until the element-isolating step or later steps.

After dummy dies, used as alignment marks in a flat wafer, are formed, the wafer is loaded on a defect detecting apparatus in which the edge portions of the dummy dies are, then, arranged. Subsequently, using the pattern dies to be formed on the flat wafer or finer regions as unit regions, defects on the flat wafer are detected to give data for the coordinates and sizes thereof. Based on the data, analysis is undertaken to determine whether the defects are removed or a subsequent step, such as an element-isolating step or a patterning step, is carried out in a defective state. After carrying out the subsequent step, pattern defects are inspected and analyzed in conjunction with the data for the defects generated on the flat wafer.

The defect detecting apparatus designates an area which is larger than the unit size of a repeating pattern in pattern dies, detects an image difference by comparing the area with the size of the pattern on the left or right of the area, and determines the coordinates as a defect if the difference is over a predetermined limit. Such detected data for defects is used to correct or compensate for the defects at subsequent steps, allowing the fabricating processes to be easily analyzed on the basis of process defects.

In accordance with the present invention, the defects of a flat wafer are detected and then utilized to inspect for process defects at subsequent process steps, which makes it easy to monitor organic relations between the wafer defects and the process defects and between the process defects themselves.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for detecting wafer defects, comprising the steps of:

forming dummy dies at edge portions of a flat wafer containing no pattern die;

performing a first step of inspecting defects on a surface of the wafer containing no pattern die;

determining the coordinates of the defects, using said dummy dies as reference marks;

performing a pattern die forming step;

performing a second step of inspecting defects on a surface of the wafer after said die forming step; and comparing the defect coordinates and characteristics from said first and said second defect inspecting steps.

2. A method in accordance with claim 1, wherein said dummy dies are formed with rectangular protrusive or depressive photosensitive film patterns.

3. A method in accordance with claim 1, wherein two dummy dies are formed on said wafer.

4. A method in accordance with claim 1, wherein said dummy dies formed on said wafer are etched to a predetermined depth.

5. A method in accordance with claim 1, wherein said flat wafer is a bare wafer or film-deposited wafer having a smooth surface.

* * * * *